(12) United States Patent
Mokhlesi

(10) Patent No.: US 10,157,681 B2
(45) Date of Patent: Dec. 18, 2018

(54) PROGRAMMING OF NONVOLATILE MEMORY WITH VERIFY LEVEL DEPENDENT ON MEMORY STATE AND PROGRAMMING LOOP COUNT

(71) Applicant: SanDisk Technologies LLC, Plano, TX (US)

(72) Inventor: Nima Mokhlesi, Los Gatos, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/853,733

(22) Filed: Sep. 14, 2015

(65) Prior Publication Data
US 2017/0076802 A1   Mar. 16, 2017

(51) Int. Cl.
*G11C 16/34* (2006.01)
*G11C 11/56* (2006.01)
*G11C 16/10* (2006.01)

(52) U.S. Cl.
CPC ...... *G11C 16/3459* (2013.01); *G11C 11/5628* (2013.01); *G11C 16/10* (2013.01); *G11C 16/3481* (2013.01); *G11C 2211/5621* (2013.01); *G11C 2211/5622* (2013.01); *G11C 2211/5624* (2013.01)

(58) Field of Classification Search
CPC ..... G11C 16/14; G11C 16/28; G11C 16/3459; G11C 16/3495; G11C 16/0483; G11C 16/10; G11C 16/3481
USPC .......................... 365/185.12, 185.03, 185.17
See application file for complete search history.

(56) References Cited

U.S. PATENT DOCUMENTS

| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |

(Continued)

OTHER PUBLICATIONS

Eitan, B. et al., "NROM: A Novel Localized Trapping, 2-Bit Nonvolatile Memory Cell," *IEEE Electron Device Letters*, vol. 21, No. 11, pp. 543-545 (Nov. 2000).

(Continued)

*Primary Examiner* — T. Bui
*Assistant Examiner* — Alfredo Bermudez Lozada
(74) *Attorney, Agent, or Firm* — Stoel Rives LLP

(57) ABSTRACT

A series of programming pulses, where the individual pulses are identified by a pulse number, is used to program a page of memory cells in parallel. After receiving a pulse, the memory cells under verification are verified to determine if they have been programmed to their respective target states. The memory cells that have been verified are inhibited from further programming while those memory cells not verified will be further programmed by subsequent programming pulses. The pulsing, verification and inhibition continue until all memory cells of the page have been program-verified. Each verify level used in the verification is a function of both the target state and the pulse number. This allows adjustment of the verify level to compensate for changes in sensing, including those due to variation in source line loading during the course of programming.

20 Claims, 15 Drawing Sheets

(56) References Cited

U.S. PATENT DOCUMENTS

| | | |
|---|---|---|
| 5,768,192 A | 6/1998 | Eitan |
| 5,774,397 A | 6/1998 | Endoh et al. |
| 5,903,495 A | 5/1999 | Takeuchi et al. |
| 6,011,725 A | 1/2000 | Eitan |
| 6,046,935 A | 4/2000 | Takeuchi et al. |
| 6,125,052 A * | 9/2000 | Tanaka ................ G11C 11/5621 365/185.03 |
| 6,222,762 B1 | 4/2001 | Guterman et al. |
| 6,373,746 B1 | 4/2002 | Takeuchi et al. |
| 6,456,528 B1 | 9/2002 | Chen |
| 6,522,580 B2 | 2/2003 | Chen et al. |
| 6,643,188 B2 | 11/2003 | Tanaka et al. |
| 6,657,891 B1 | 12/2003 | Shibata et al. |
| 6,771,536 B2 | 8/2004 | Li et al. |
| 6,781,877 B2 | 8/2004 | Cernea et al. |
| 7,023,739 B2 | 4/2006 | Chen et al. |
| 7,099,196 B2 | 8/2006 | Suh et al. |
| 7,177,191 B2 | 2/2007 | Fasoli et al. |
| 7,342,279 B2 | 3/2008 | Harari et al. |
| 7,397,704 B2 | 7/2008 | Sim |
| 7,558,141 B2 | 7/2009 | Katsumata et al. |
| 8,405,142 B2 | 3/2013 | Katsumata et al. |
| 8,675,416 B2 | 3/2014 | Lee |
| 8,885,416 B2 | 11/2014 | Mui et al. |
| 8,933,516 B1 | 1/2015 | Wu et al. |
| 8,953,368 B2 | 2/2015 | Cha |
| 2005/0169082 A1 | 8/2005 | Cernea |
| 2006/0184720 A1 | 8/2006 | Sinclair et al. |
| 2008/0253181 A1* | 10/2008 | Edahiro ............. G11C 16/3418 365/185.03 |
| 2008/0304325 A1* | 12/2008 | Mokhlesi ................ G11C 7/12 365/185.21 |
| 2009/0001344 A1 | 1/2009 | Schricker et al. |
| 2009/0147573 A1* | 6/2009 | Hemink ............. G11C 11/5628 365/185.03 |
| 2012/0220088 A1 | 8/2012 | Alsmeier |
| 2012/0307561 A1* | 12/2012 | Joo .................... G11C 16/0483 365/185.17 |
| 2013/0107628 A1 | 5/2013 | Dong et al. |
| 2015/0103595 A1* | 4/2015 | Dunga ............... G11C 16/3459 365/185.03 |
| 2016/0086674 A1 | 3/2016 | Ray et al. |

OTHER PUBLICATIONS

U.S. Appl. No. 14/602,468, entitled Adaptive Multi-Page Programming Methods and Apparatus for Non-Volatile Memory, filed Jan. 22, 2015.

* cited by examiner

3D NAND MEMORY

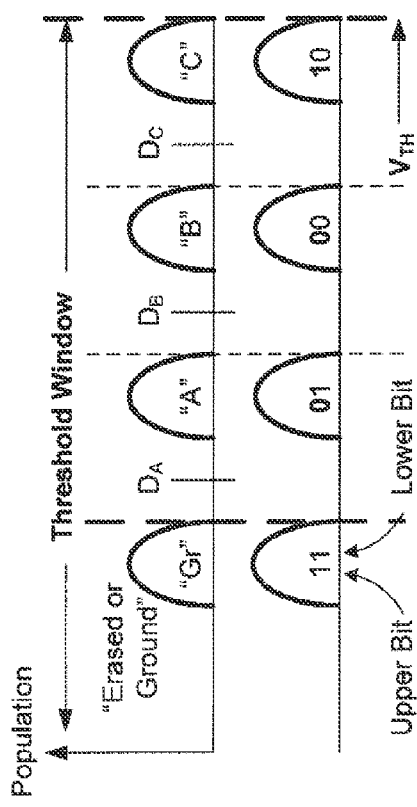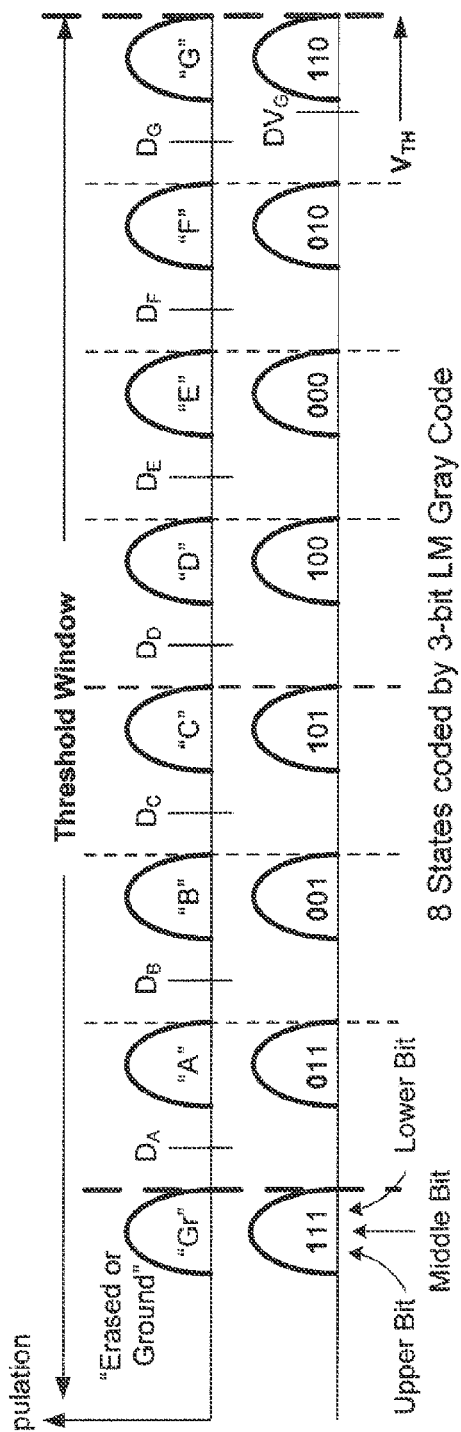
FIG. 8(1)
FIG. 8(2)
FIG. 9(1)
FIG. 9(2)

Convention Programming with alternate Progam/Verify sequence

| VV(s,p) | s1 | s2 | s3 | s4 | s5 | s6 | s7 | s8 | s9 | s10 | ..... |
|---|---|---|---|---|---|---|---|---|---|---|---|
| p1 | ... | ... | ... | ... | ... | ... | ... | ... | ... | ... | |
| p2 | ... | ... | ... | ... | ... | ... | ... | ... | ... | ... | |
| p3 | ... | ... | ... | ... | ... | ... | ... | ... | ... | ... | |
| p4 | ... | ... | ... | ... | ... | ... | ... | ... | ... | ... | |
| p5 | ... | ... | ... | ... | ... | ... | ... | ... | ... | ... | |
| p6 | ... | ... | ... | ... | ... | ... | ... | ... | ... | ... | |
| p7 | ... | ... | ... | ... | ... | ... | ... | ... | ... | ... | |
| p8 | ... | ... | ... | ... | ... | ... | ... | ... | ... | ... | |
| p9 | ... | ... | ... | ... | ... | ... | ... | ... | ... | ... | |
| p10 | ... | ... | ... | ... | ... | ... | ... | ... | ... | ... | |
| p11 | ... | ... | ... | ... | ... | ... | ... | ... | ... | ... | |
| p12 | ... | ... | ... | ... | ... | ... | ... | ... | ... | ... | |

Lookup Table for Verify level as a function of target state and pulse number

*FIG. 15*

PROGRAMMING OF NONVOLATILE MEMORY WITH VERIFY LEVEL DEPENDENT ON MEMORY STATE AND PROGRAMMING LOOP COUNT

BACKGROUND

This application relates generally to the structure, use and making of re-programmable non-volatile memory cell arrays, and, more specifically, to programming techniques for two- or three-dimensional arrays of such memory storage elements formed on and above semiconductor substrates.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. SanDisk Corporation, assignee hereof, sells flash drives under its Cruzer, Ultra and Extreme Contour trademarks. In yet another form of flash memory systems, a large amount of memory is permanently installed within host systems, such as within a notebook computer in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

There are two primary techniques by which data are communicated between the host and flash memory systems. In one of them, addresses of data files generated or received by the system are mapped into distinct ranges of a continuous logical address space established for the system. The extent of the address space is typically sufficient to cover the full range of addresses that the system is capable of handling. As one example, magnetic disk storage drives communicate with computers or other host systems through such a logical address space. The host system keeps track of the logical addresses assigned to its files by a file allocation table (FAT) and the memory system maintains a map of those logical addresses into physical memory addresses where the data are stored. Most memory cards and flash drives that are commercially available utilize this type of interface since it emulates that of magnetic disk drives with which hosts have commonly interfaced.

In the second of the two techniques, data files generated by an electronic system are uniquely identified and their data logically addressed by offsets within the file. Theses file identifiers are then directly mapped within the memory system into physical memory locations. Both types of host/memory system interfaces are described and contrasted elsewhere, such as in patent application publication no. US 2006/0184720 A1.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally employed for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells. An example of an array of variable resistive memory elements and associated diodes is given in patent application publication no. US 2009/0001344 A1.

Typically, for programming and read performances, a page of memory cells with a common word line is programmed or read in parallel. Programming is implemented by applying a series of voltage pulses to the word line. The series of voltage pulses is configured to program the individual memory cells of the page incrementally. The page of memory cells are verified after each voltage pulse to see if the individual memory cells have been programmed to their respective target states. Any cells so verified are then inhibited from further programming. The application of the voltage pulse and verification proceeds until all the memory cells of the page have been verified. The verify level for each target state is predetermined and fixed. However, this scheme may not result in accurately programmed memory states or a memory with programmed states in a tight distribution.

SUMMARY

According to the present improved programming technique, a series of programming pulses, where the individual pulses are identified by a pulse number, is used to program a page of memory cells in parallel. After receiving a pulse, the memory cells under verification are verified to determine if they have been programmed to their respective target states. The memory cells that have been verified are inhibited from further programming while those memory cells not verified will be further programmed by subsequent programming pulses. The pulsing, verification and inhibition continue until all or a sufficiently large majority of memory cells of the page have been program-verified. Each verify level used in the verification is a function of both the target state and the pulse number. This allows adjustment of the verify level to compensate for changes in sensing, including those due to variation in source line loading during the course of programming.

An improved method of programming a group of memory cells to respective target states in parallel, includes providing a programming voltage waveform having a series of voltage pulses identified by a pulse number; programming the group of memory cells in parallel by applying the programming voltage waveform; verifying after a pulse has been applied whether individual memory cells of the group have been programmed to the respective target states, wherein the memory cell being verified is sensed relative to a verify level given as a predetermined function of both the target state and the pulse number of the pulse; inhibiting the verified memory cells in the group from programming; and repeating said applying of a pulse, verifying and inhibiting until all memory cells of the group have been verified.

In another embodiment, the improved method of programming employs verify levels compensated for the error in sensing due to a finite voltage gain/drop in a ground loop of a page of memory cells during a programming cycle. The voltage gain/drop is given by an aggregate current in the ground loop contributed by all the memory cells of the page. The compensation is estimated from a predetermined relation between the voltage drop and pulse number.

In particular, as the pulse number increases in a programming cycle, more and more memory cells of the page are program-verified. Each program-verified cell has its cell current turned off during subsequent to lockout verify operations and therefore has its contribution to the aggregate current removed. This forms the basis of determining the predetermined relation between the voltage drop and pulse number and therefore the compensation for the verify level. Also as cells are programmed closer and closer to their respective target thresholds, the cell currents naturally reduce.

Various aspects, advantages, features and embodiments of the present subject matters are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 8(1) illustrates the threshold voltage distributions of an example 4-state memory array with an erased state as a ground state "Gr" and progressively more programmed memory states "A", "B" and "C".

FIG. 8(2) illustrates a 2-bit LM coding to represent the four possible memory states shown in FIG. 8(1).

FIG. 9(1) illustrates the threshold voltage distributions of an example 8-state memory array.

FIG. 9(2) illustrates a 3-bit LM coding to represent the eight possible memory states shown in FIG. 9(1).

FIG. 15 illustrates schematically a lookup table for reading off the verify level as a function of target state and pulse number.

DETAILED DESCRIPTION

Memory System

Figure 1:
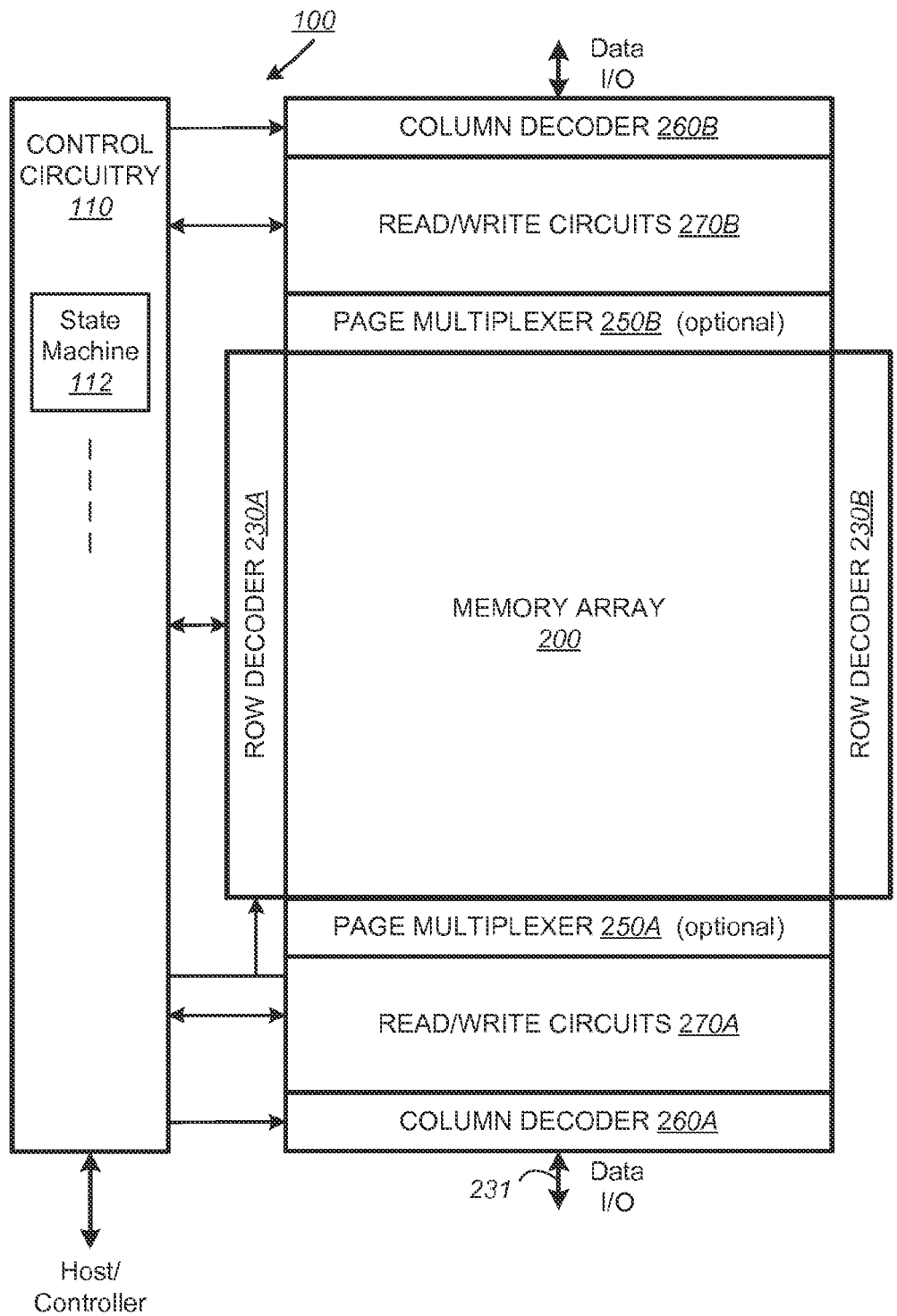
FIG. 1 illustrates schematically the functional blocks of a non-volatile memory chip in which the present subject matter may be implemented.

FIG. 1 illustrates schematically the functional blocks of a non-volatile memory chip in which the present subject matter may be implemented. The memory chip 100 includes a two-dimensional array of memory cells 200, control circuitry 210, and peripheral circuits such as decoders, read/write circuits and multiplexers.

Figure 4:
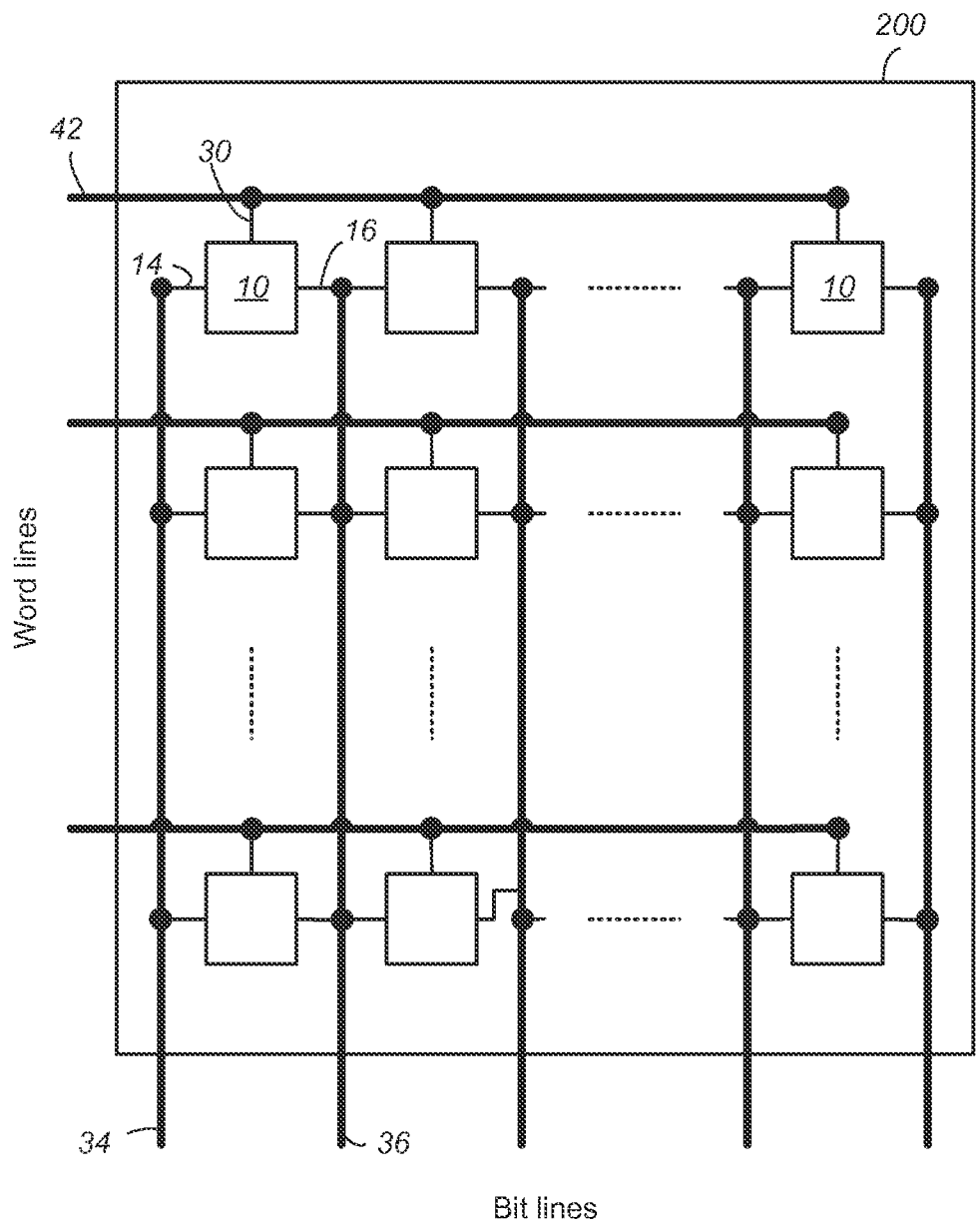
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In an embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates an arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
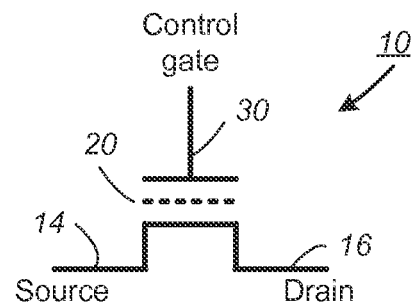
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
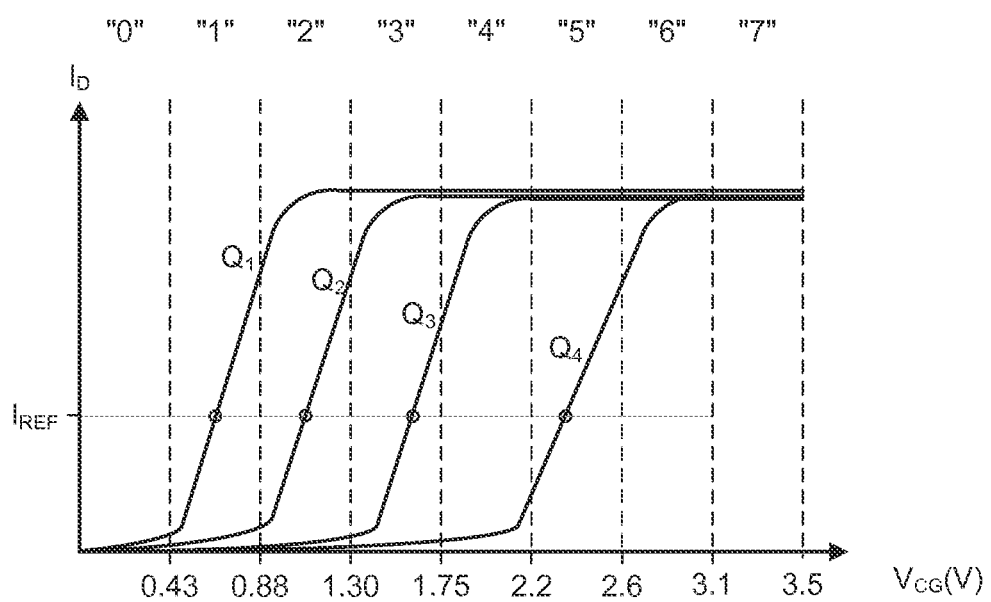
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6" and "7" respectively representing one erased and seven programmed states, may be demarcated by partitioning the threshold window into eight regions in interval of about 0.4V each. For example, if a reference current, IREF of 0.05 uA is used as shown, then the cell programmed with Q1 may be considered to be in a memory state "1" since its curve intersects with $I_{REF}$ in the region of the threshold window demarcated by VCG=0.43V and 0.88V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 350 mV to 450 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
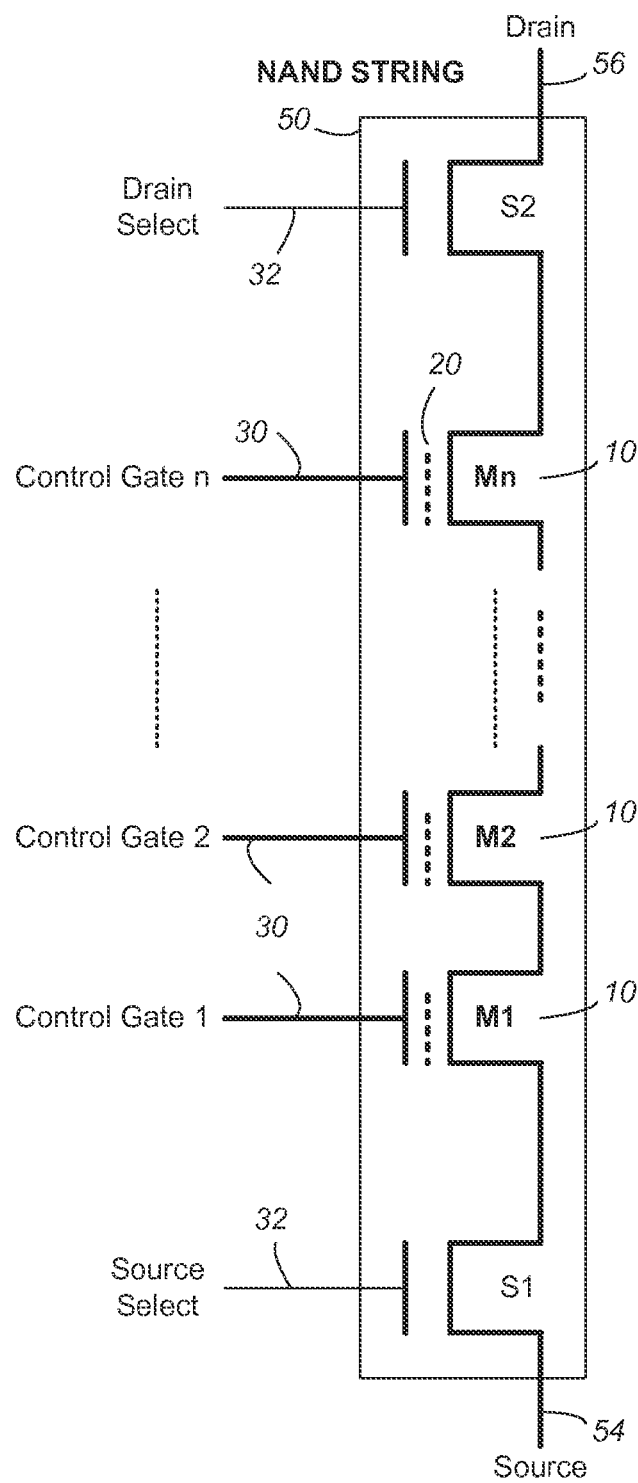
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
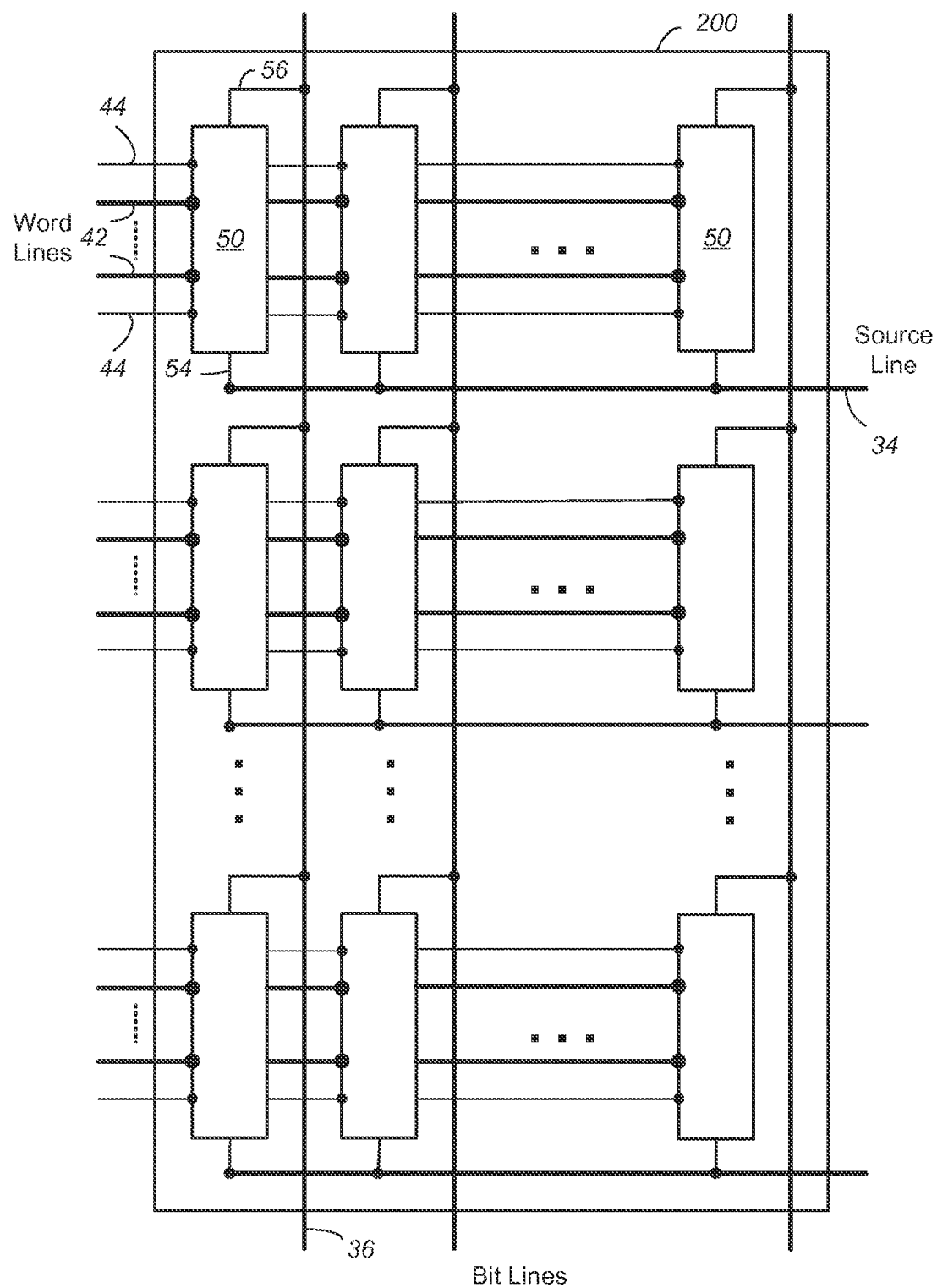
FIG. 5B illustrates an example of an NAND array of memory cells, constituted from NAND strings such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

3-D NAND Structure

Figure 6:
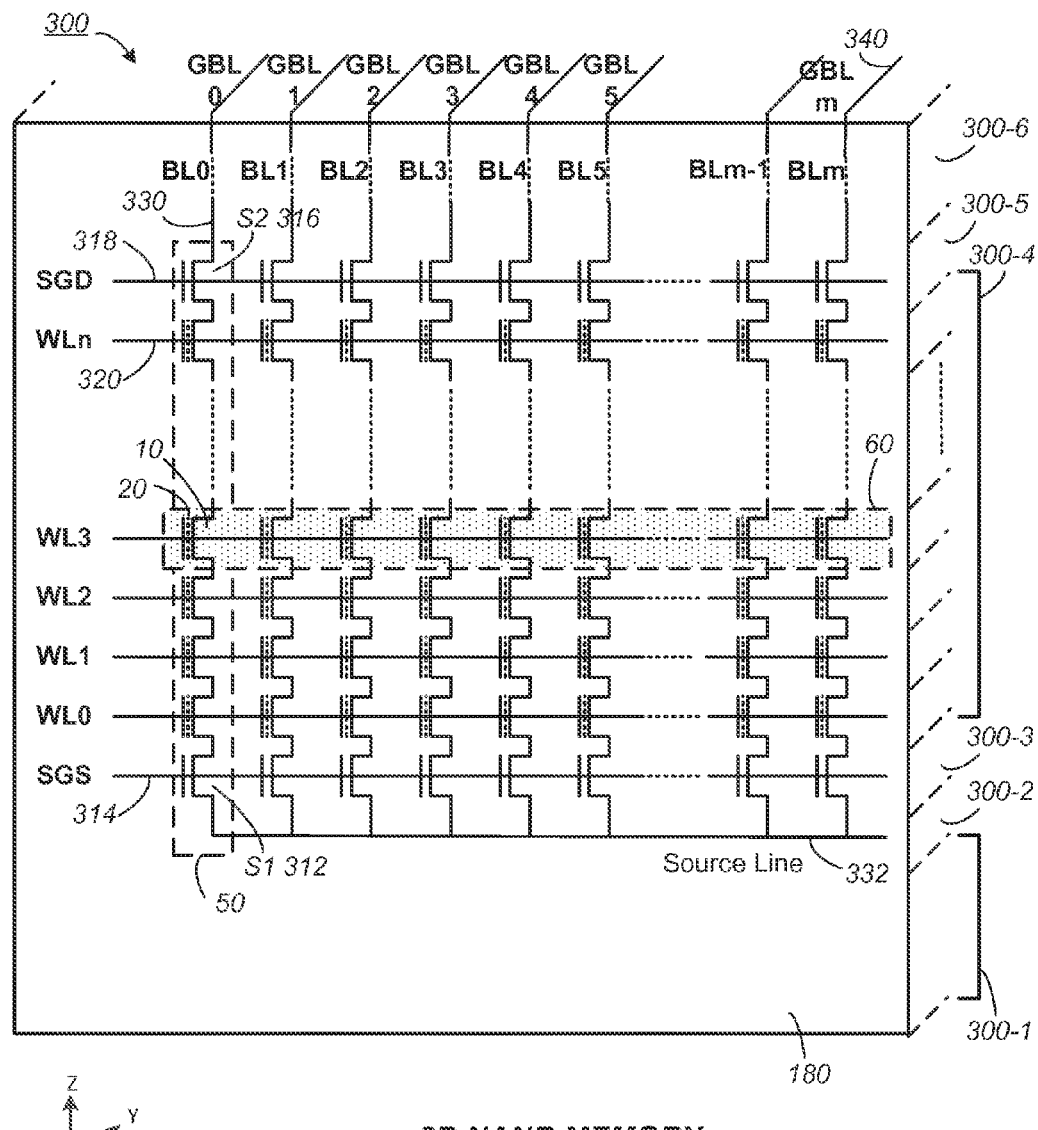
FIG. 6 is a schematic illustration of a 3D NAND memory.

FIG. 6 is a three-dimensional (3D) NAND array, which further extends a conventional two-dimensional (2D) NAND array. In contrast to 2D NAND arrays, which are formed in a substrate of a planar surface of a semiconductor wafer, 3D arrays are formed on stacks of memory layers extend up from the substrate. Various 3D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Pat. No. 7,558,141, U.S. Pat. No. 8,405,142, U.S. Patent Publication Number 2012/0220088 and in U.S. Patent Publication Number 2013/0107628.

FIG. 6 is a schematic illustration of a 3D NAND memory. The 3D NAND memory 300 has a 2D array of vertical NAND strings 50 in the x-y plane on top of the substrate 180. Memory cells 10 are at crossings where a vertical bit line 330 (local bit line, e.g., BL0, BL1, etc.) 330 crosses a word line 320 (e.g. WL0, WL1, etc.). The page of vertical bit lines BL0-BLm 330, crossed by the same word line 320, are switchably connected to sense amplifiers (not shown) via corresponding global bit lines GBL0-GBLm 340. The global bit lines 340 are running along the y-direction and spaced apart in the x-direction. In one embodiment, the word lines 320 and the global bit lines 340 are metal lines.

As with planar NAND strings, select transistors S1 312, S2 316, are located at either end of the string to allow the NAND string to be selectively connected to, or isolated from external elements. For example, the select transistor S1 312, in response to a signal on a control line SGS 314, switches the source side of a NAND string to a common source line 332. The select transistor S2 316, in response to a signal on a control line SGD 318, switches the drain side of a NAND string to a global bit line 340.

Figure 7:
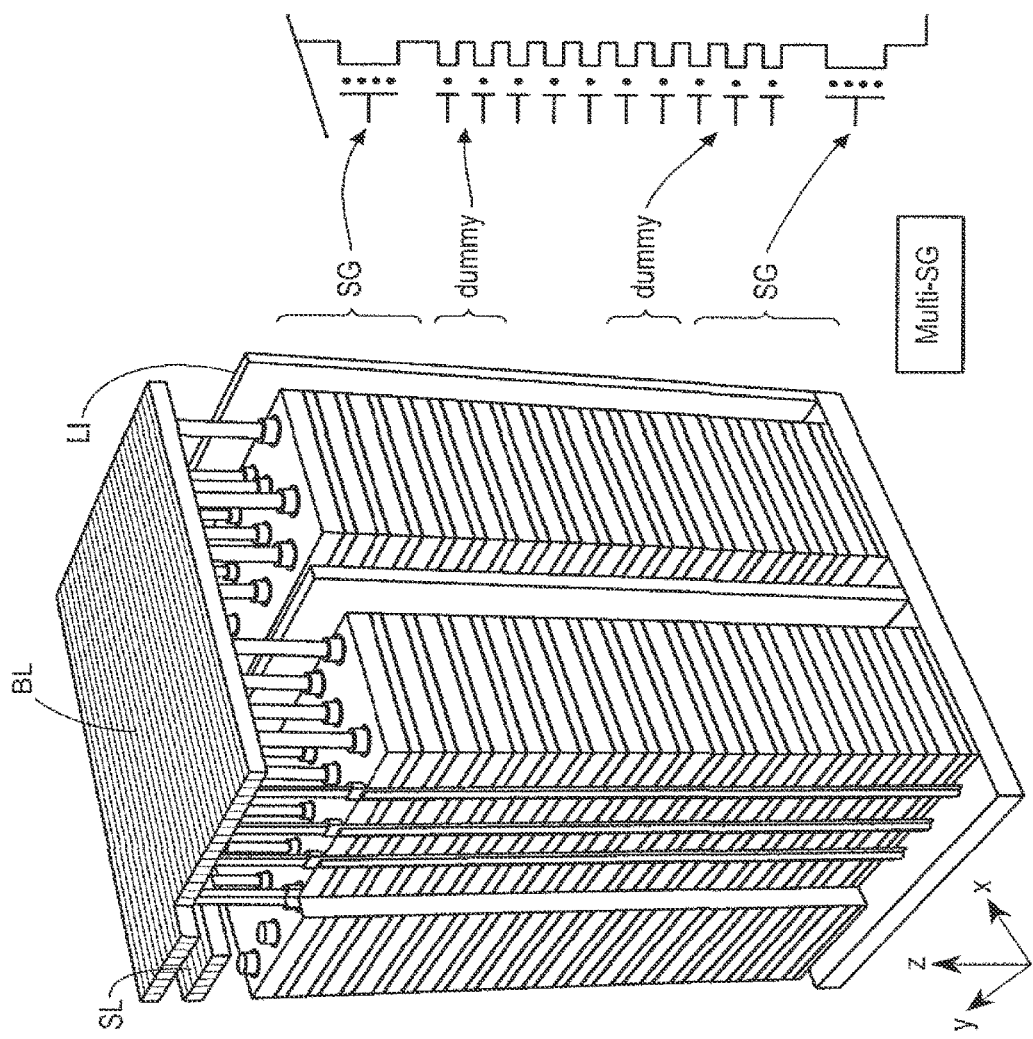
FIG. 7 is an oblique projection of part of a 3D NAND memory.

Vertical NAND strings may be operated in a similar manner to planar NAND strings and both SLC and MLC operations are possible. While FIG. 7 shows explicitly one bank of vertical NAND strings, it will be understood that similar banks are spaced apart in the y-direction.

The 3D NAND memory 150 forms multiple layers on top of a substrate 180 (layer 300-1). As the NAND strings 50 are aligned vertically, each of the multiple layers corresponds to a structure of the vertical NAND string.

For example, a metal layer 320-2 including the source lines 332 is on top of the substrate 180. The metal line layer 320-2 is followed by a source-side switch layer 300-3, which corresponds to the source-side switch S1 312 and control line SGS 314.

The source-side switch layer 300-3 is followed by a series of memory layers 300-4 where the memory cells and word lines of the NAND string will reside. In general, each memory cell in a vertical NAND chain 50 will be in a different memory layer.

The series of memory layers 300-4 is followed by a drain-side switch layer 300-5, which corresponds to the drain-side switch S2 316 and control line SGD 318.

The drain-side switch layer 300-5 is followed by a second metal line layer 300-6, which corresponds to the global bit lines 340.

FIG. 7 is an oblique projection of part of a 3D NAND memory. FIG. 7 illustrate a portion corresponding to two of the page structures in FIG. 6, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 7 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Examples of Memory State Partitioning

FIG. 8(1) illustrates the threshold voltage distributions of an example 4-state memory array with an erased state as a ground state "Gr" and progressively more programmed memory states "A", "B" and "C". During read, the four states are demarcated by three demarcation breakpoints, $D_A$-$D_C$.

FIG. 8(2) illustrates a 2-bit LM coding to represent the four possible memory states shown in FIG. 8(1). Each of the memory states (viz., "Gr", "A", "B" and "C") is represented by a pair of "upper, lower" code bits, namely "11", "01", "00" and "10" respectively. The "LM" code has been disclosed in U.S. Pat. No. 6,657,891 and is advantageous in reducing the field-effect coupling between adjacent floating gates by avoiding program operations that require a large change in charges. The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIG. 9(1) illustrates the threshold voltage distributions of an example 8-state memory array. The possible threshold voltages of each memory cell spans a threshold window which is partitioned into eight regions to demarcate eight possible memory states, "Gr", "A", "B", "D", "E", "F" and "G". "Gr" is a ground state, which is an erased state within a tightened distribution and "A"-"G" are seven progressively programmed states. During read, the eight states are demarcated by seven demarcation breakpoints, $D_A$-$D_G$.

FIG. 9(2) illustrates a 3-bit LM coding to represent the eight possible memory states shown in FIG. 9(1). Each of the eight memory states is represented by a triplet of "upper, middle, lower" bits, namely "111", "011", "001", "101", "100", "000", "010" and "110" respectively. The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

Sensing Circuits and Techniques

Figure 10:
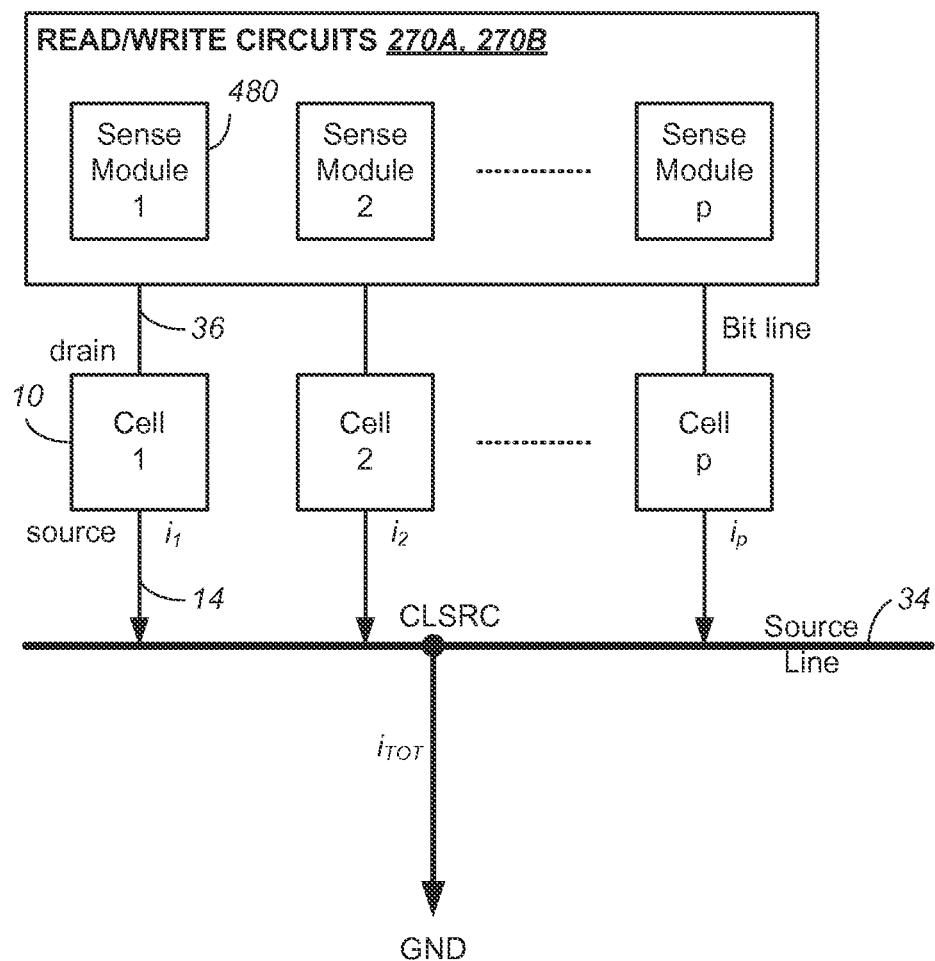
FIG. 10 illustrates the Read/Write Circuits, shown in FIG. 1, containing a bank of sense modules across an array of memory cells.

FIG. 10 illustrates the Read/Write Circuits 270A and 270B, shown in FIG. 1, containing a bank of p sense modules across an array of memory cells. The entire bank of p sense modules 480 operating in parallel allows a block for page) of p cells 10 along a row to be read or programmed in parallel. Essentially, sense module 1 will sense a current $I_1$ in cell 1, sense module 2 will sense a current $I_2$ in cell 2, ..., sense module p will sense a current $I_p$ in cell p, etc. The total cell current $i_{TOT}$ for the page flowing out of the source line 34 into an aggregate node CLSRC and from there to ground will be a summation of all the currents in the p cells.

For example in a chip with 56 nm technology p>64000 and in a 43 nm 32 Gbit×4 chip p>150000. In one embodiment, the block is a run of the entire row of cells. This is the "all-bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B. Sense modules have been disclosed in US Patent Publication No. 2005-0169082-A1, dated Aug. 4, 2005 by Cernea et al., entitled "IMPROVED MEMORY SENSING CIRCUIT AND METHOD FOR LOW VOLTAGE OPERATION". The entire disclosure of US Patent Publication No. 2005-0169082-A1 is incorporated herein by reference.

Issues with High-Current Memory Cells During Sensing

As described earlier, in order to increase read performance, a page of memory cells is sensed in parallel and the larger the page, the higher the performance. However, as is evident from FIG. 10, operating a large number of cells in parallel will also consume a large amount of current.

A number of issues arise from operating with large amount of current. Generally, it is always desirable to have a device consuming less power. In particular, components having to accommodate higher current will likely be more bulky and take up valuable chip space. Often, the memory device is designed for the worse-case current while most of the time much less current is operating. This is because the current is dependent on the data programmed into the cells. For example, in the case of charge-storage memory devices, the less programmed cells have higher conduction currents.

Another issue has to do with an error introduced by a finite resistance between the source line and the ground pad of the chip. One potential problem with sensing memory cells is source line bias caused by source loading across the finite resistance. When a large number memory cells are sensed in parallel, their combined currents can result in significant voltage drop in a ground loop with finite resistance. This results in a source line bias which causes error in a read operation employing threshold voltage sensing.

Figure 11:
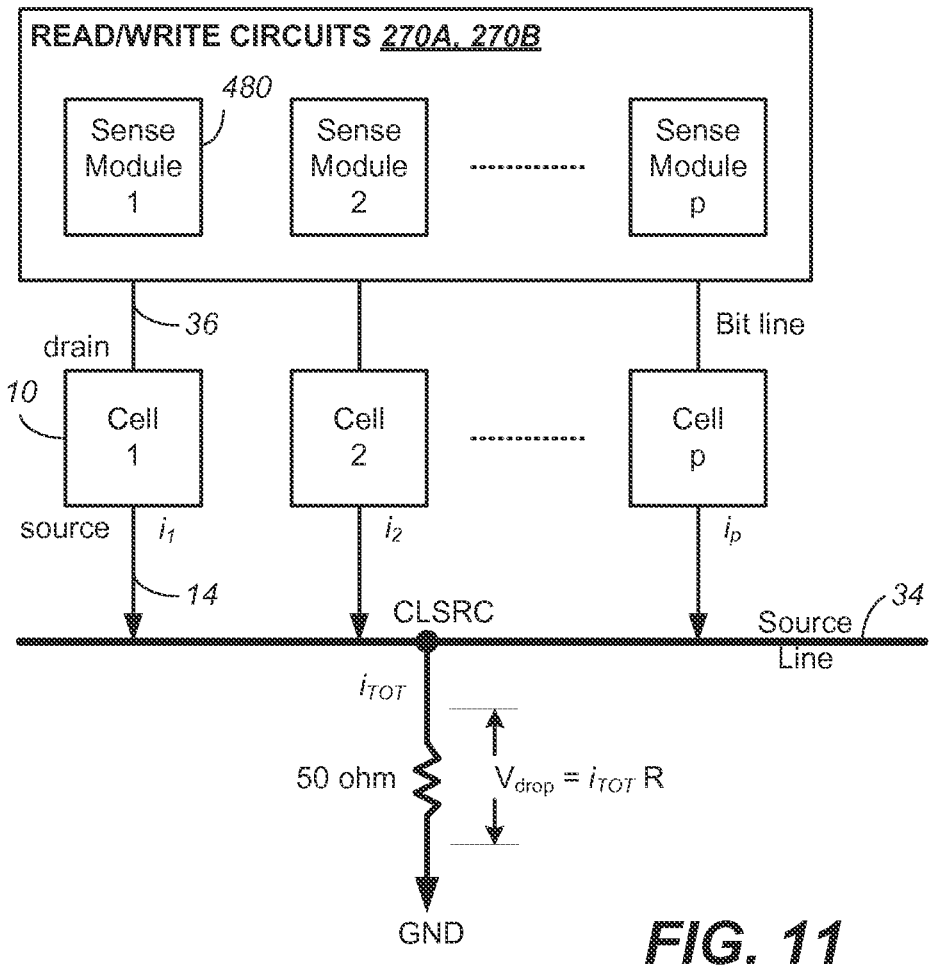
FIG. 11 illustrates the problem of source voltage error due to current flow in the source line having a finite resistance to ground.

FIG. 11 illustrates the problem of source voltage error due to current flow in the source line having a finite resistance to ground. The read/write circuits 270A and 270B operate on a page of memory cells simultaneously. Each sense modules 480 in the read/write circuits is coupled to a corresponding cell via a bit line 36. For example, a sense module 480 senses the conduction current $i_1$ (source-drain current) of a memory cell 10. The conduction current flows from the sense module through the bit line 36 into the drain of the memory cell 10 and out from the source 14 before going through a common source line CLSRC 34 to ground. In an integrated circuit chip, the common source line CLSRC 34 is connected to an external ground pad (e.g. Vss pad) of the memory chip. Even when metal strapping is used to reduce the resistance of the source line, a finite resistance, R, remains between the source electrode of a memory cell and the ground pad. Typically, the ground loop resistance R is around 50 ohm.

For the entire page of memory being sensed in parallel, the total current flowing through the source line CLSRC 34 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a small charge will yield a comparatively higher conduction current (see FIG. 3.) When a finite resistance exists between the source electrode of a memory cell and the ground pad, the voltage drop across the resistance is given by $V_{drop}=i_{TOT}R$.

For example, if 24000 bit lines discharge at the same time, each with a current of 0.25 µA, then the source line voltage drop will be equal to 24000 lines×0.25 µA/line×50 ohms~0.3 volts. This source line bias will contribute to a sensing error of 0.45 volts when threshold voltages of the memory cells are sensed, assuming that the body effect is such that 0.3V rise in source voltage results in a 0.45V rise in threshold voltage.

Figure 12:
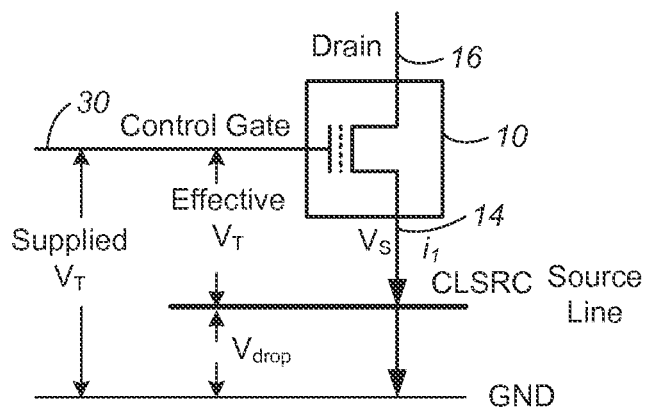
FIG. 12 illustrates the error in the threshold voltage level of a memory cell caused by a source line voltage drop.

FIG. 12 illustrates the error in the threshold voltage level of a memory cell caused by a source line voltage drop. The threshold voltage $V_T$ supplied to the control gate 30 of the memory cell 10 is relative to GND. However, the effective $V_T$ seen by the memory cell is the voltage difference between its control gate 30 and source 14. There is a difference of approximately $1.5\times V_{drop}$ between the supplied and effective $V_T$ (ignoring the smaller contribution of voltage drop from the source 14 to the source line.) This $V_{drop}$ or source line bias will contribute to a sensing error of, for example 0.45 volts when threshold voltages of the memory cells are sensed. This bias cannot be easily removed as it is data-dependent, i.e., dependent on the memory states of the memory cells of the page.

Figure 13:
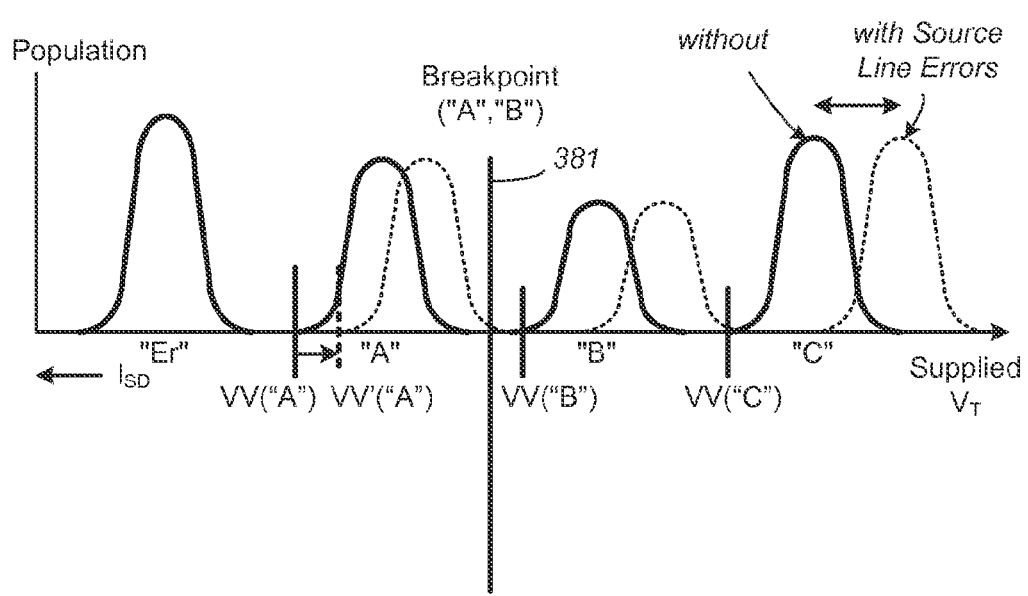
FIG. 13 illustrates the shifting due to source voltage error of an example population distribution of a page of memory cells for a 4-state memory.

FIG. 13 illustrates the shifting due to source voltage error of an example population distribution of a page of memory cells for a 4-state memory. Each cluster of memory state is programmed within a range of conduction currents $I_{SD}$ clearly separated from each other. For example, a breakpoint 381 is a demarcating current value between two clusters, respectively representing the "A" and "B" memory states. In a conventional single-pass sensing, a necessary condition for a "B" memory state will be that it has a conduction current less than the breakpoint 381. If there were no source line bias (i.e., R=0, see FIG. 11 and FIG. 12), the population distribution with respect to the supplied threshold voltage $V_T$ will be given by the curve with the solid line. However, because of the source line bias error, the threshold voltage of each of the memory cells at its control gate is increased by the source line bias. This means a higher control gate voltage need be applied to compensate for the bias. In FIG. 13, the source line bias results in a shifting of the distribution (broken line) towards a higher supplied $V_T$. The shifting will be more for that of the higher (lower current) memory states. If the breakpoint 381 is designed for the case without source line error, then the existence of a source line error will have some of the tail end of "A" states having conduction currents to appear in a region of no conduction, which means higher than the breakpoint 381. This will result in some of the "A" states (more conducting) being mistakenly demarcated as "B" states (less conducting.)

Program and Verify

Figure 14:
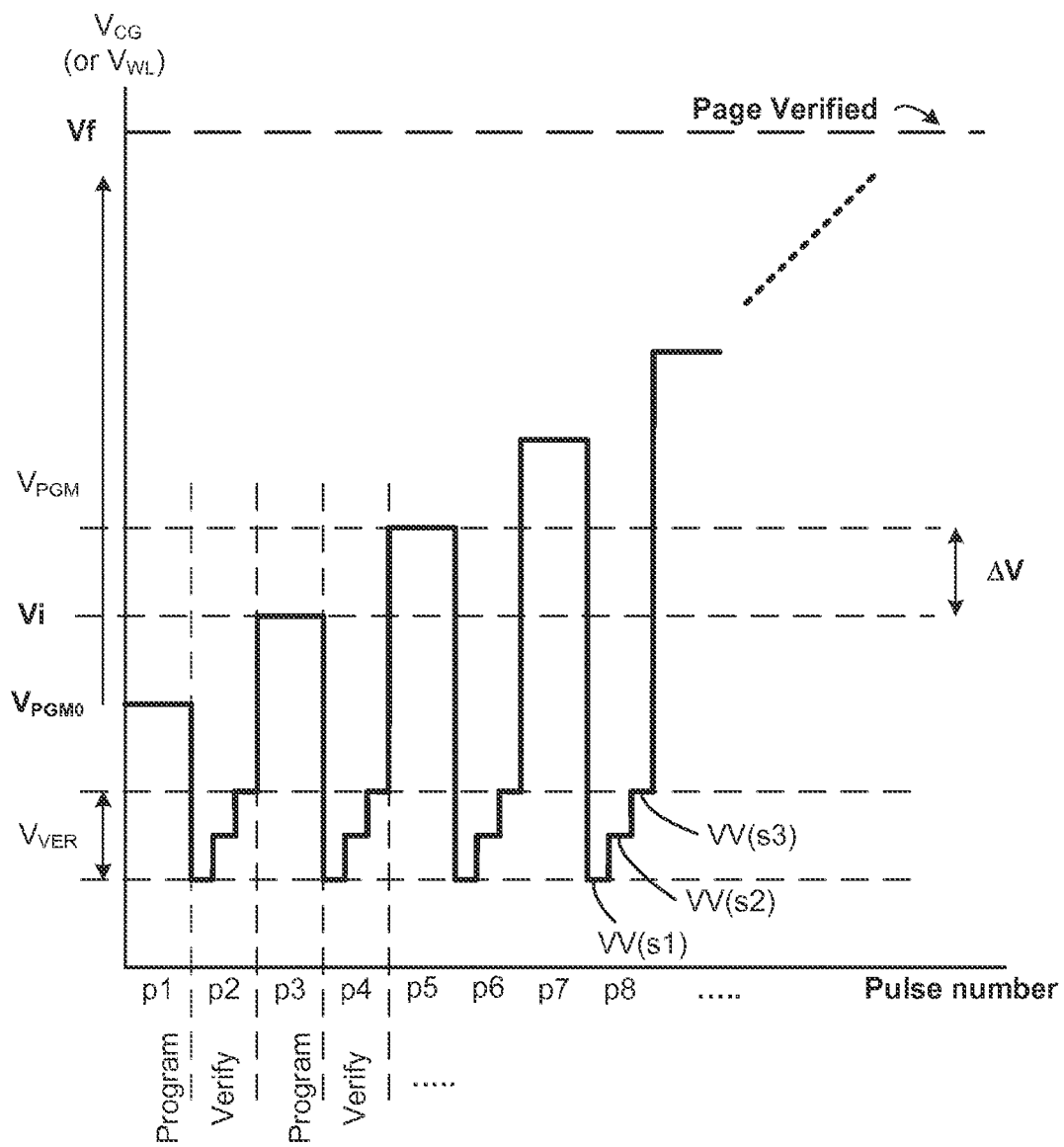
FIG. 14 illustrates a typical technique for programming a page of memory cells to a target memory state by a series of alternating program/verify cycles.

FIG. 14 illustrates a typical technique for programming a page of memory cells to a target memory state by a series of alternating program/verify cycles. A programming voltage $V_{PGM}$ is applied to the control gate of the memory cell via a coupled word line. The $V_{PGM}$ is a series of programming voltage pulses in the form of a staircase waveform starting from an initial voltage level, $V_{PGM0}$ and incremented pulse by pulse by $\Delta V$ to a final voltage level, Vf. The programming pulse train used may have increasing period or amplitude in order to counteract the accumulating electrons programmed into the charge storage unit of the memory cell. For other devices, the series of programming pulses may be different. Programming circuits generally apply a series of programming pulses to a selected word line. In this way, a page of memory cells whose control gates are coupled to the word line can be programmed together. Whenever a memory cell of the page has been programmed to its target state, it is program-inhibited while the other cells continue to be subject to programming until all cells of the page have been program-verified.

In between programming pulses, the cell is verified to determine its source-drain current relative to a breakpoint level. The verify process may involve one or more sensing operation. For example, FIG. 14 shows verify relative to three memory states s1, s2 and s3 respectively using verify levels VV(s1), VV(s2) and VV(s3). Each verify level is a function of target state only, i.e., VV=VV(target state). Programming stops for the cell when it has been verified to reach the target state.

The source line bias error, also referred to as "CLRSC loading" will also cause inaccurate sensing during program verify. As shown in FIG. 13, during verify, the sensing for state "A" is normally relative to the level VV(s="A"), which defines the lower edge of the distribution of the threshold voltage $V_T$ for state "A". However, owing to the source line bias error, the apparent $V_T$ is shifted higher and therefore a higher VV'(s="A") should be used.

Verify Levels Dependent on both Target State and Pulse Number, VV=VV(s, p)

According to the present improved programming technique, a series of incremental programming pulses, where the individual pulses are identified by a pulse number, is used to program a page of memory cells in parallel. After receiving a pulse, the memory cells under verification are verified to determine if they have been programmed to their respective target states. The memory cells that have been verified are inhibited from further programming while those memory cells not verified will be further programmed by subsequent programming pulses. The pulsing, verification and inhibition continue until all or a sufficiently large majority of memory cells of the page have been program-verified. Each verify level used in the verification is a function of both the target state and the pulse number. This allows adjustment of the verify level to compensate for changes in sensing, including those due to variation in source line loading during the course of programming.

For the example of programming a charge-storage memory, each time a cell has been verified to its target state, it is put into a program-inhibit state by setting its bit line to Vcc during the next programming pulse to reducing the tunneling potential. During verify, the bit line of the verified cells are latched to ground and turned off.

The source line loading or CLRSC loading described above is due to the voltage drop in the ground loop of the source line to ground. The voltage drop is given by the product of the resistance on the ground loop and the aggregate of the currents from the individual memory cells of the page flowing in the source line CLRSC. During the course of programming, more and more memory cells in the page are verified and programmed inhibited. At the same time, during sensing (under verification), the verified memory cells are locked out by having their bit lines latched to ground. This effectively turns off their cell current and removes their contribution from the aggregate current in the source line CLRSC. Thus, the error in sensing due to the source line CLRSC loading decreases with pulse number as more and more of the memory cells are verified and locked out in the course of the programming pass.

FIG. 12 shows a predetermined relationship exists between the correction for the verify level and the amount of source line CLRSC loading. The compensated verify level VV' is the supplied $V_T$, which is the uncorrected VV (or Effective $V_T$)+$i_{TOT}$R, where $i_{TOT}$ is the aggregate current on the source line CLRSC and R is the ground loop resistance.

As mentioned above, in the course of a programming cycle for a page, the number of cells in the page to be programmed goes from an initial number to zero. Thus, the aggregate current in the source line CLRSC, $i_{TOT}$ decreases from an initial $i_{TOT}$(initial) at pulse number 0 to a final $i_{TOT}$(final) at pulse number final when the page of memory cells is program-verified. This means that a predetermined statistical relationship exists between the aggregate current $i_{TOT}$ and the pulse number p, viz., $i_{TOT}$=$i_{TOT}$(p). In a first order estimation, the aggregate current $i_{TOT}$ decreases linearly from an initial value to zero with increasing pulse number. By virtue of the relationship given about, the compensated verify level VV'(s, p)=VV(s)+$i_{TOT}$(p)R.

Thus, sensing the read/verify operations can be sensitive to CLSRC loading and any discrepancy between the amount of CLRSC loading at the time of verify and the amount of CLRSC loading at the time of read becomes a potential source of errors. If these discrepancies can be anticipated during the time of write, then they can be compensated for at the time of write by making the verify levels for each and all states vary based on pulse number, or based on the number of cells that have locked out of programming into various states.

FIG. 15 illustrates schematically a lookup table for reading off the verify level as a function of target state and pulse number. The entries in the table above can be changed from chip to chip and these changes are stored in non-volatile memory in a similar manner to all the other DAC controlled parameters that we have. In one embodiment, in order to save some bits per entry, these entries are recorded not as values that directly represent control gate voltages, but as offset values to be added or subtracted from other parameterized values which represent control gate voltages.

To provide a better estimate of the number of cells that have locked out of programming as a function of pulse number, the following two techniques should be considered.

First, the data of any one page should be scrambled or randomized such that all states will be present in roughly equal numbers. This practice has been in place for some type of memory device, such as employing a pseudo-random generator in encoding the data of flash memory to avoid the effect of unusual data patterns 'breaking' the memory.

Secondly, the lookup table can be built by a pre-characterization of each page during that page's soft programming in order to find the maximum possible VPGM that will not result in too many cells' overshooting the lowest programmed state, and also to find out how wide is this page's natural distribution width. This allows the forecasting of the number of cells that are turned ON during the any verify operation that follows each of the program pulses. This will provide "in advance" knowledge of the natural distribution's position and width after each pulse. Knowing this allows the estimation of CLSRC loading after each program pulse.

As an example, the verify level for state "A" (see FIG. 9 in an 4 bit per cell memory) can be chosen to be 0.4V after the first program pulse, 0.395V after the second program pulse, 0.375V after the third program pulse, etc. The proper values are best characterized and optimized on the product. The following flexibility will allow the use of the optimum values. It should become possible to define the verify level for each state after each pulse completely or at least somewhat independently of one another.

In programming schemes that involves coarse/fine verify levels, one table can be used for verify coarse (low), and another table for verify fine (high).

This programming with verify level dependent on pulse number is application to invention is application to many other programming schemes including single and double strobe sensing. In general, if there are multi-strobe sensing, there will be a table for each verify strobe.

Also, there can exist several tables like the one above one for each step size (each pass of a multi-pass programming algorithm may have a different step size, and the CLSRC loading change between verify and the later read will be different for each step).

It may also be useful to have tables unique to the word line position within a block. For example, all word line 0's will use one table, all word line 1's will use a different table, and so on.

Figure 16:
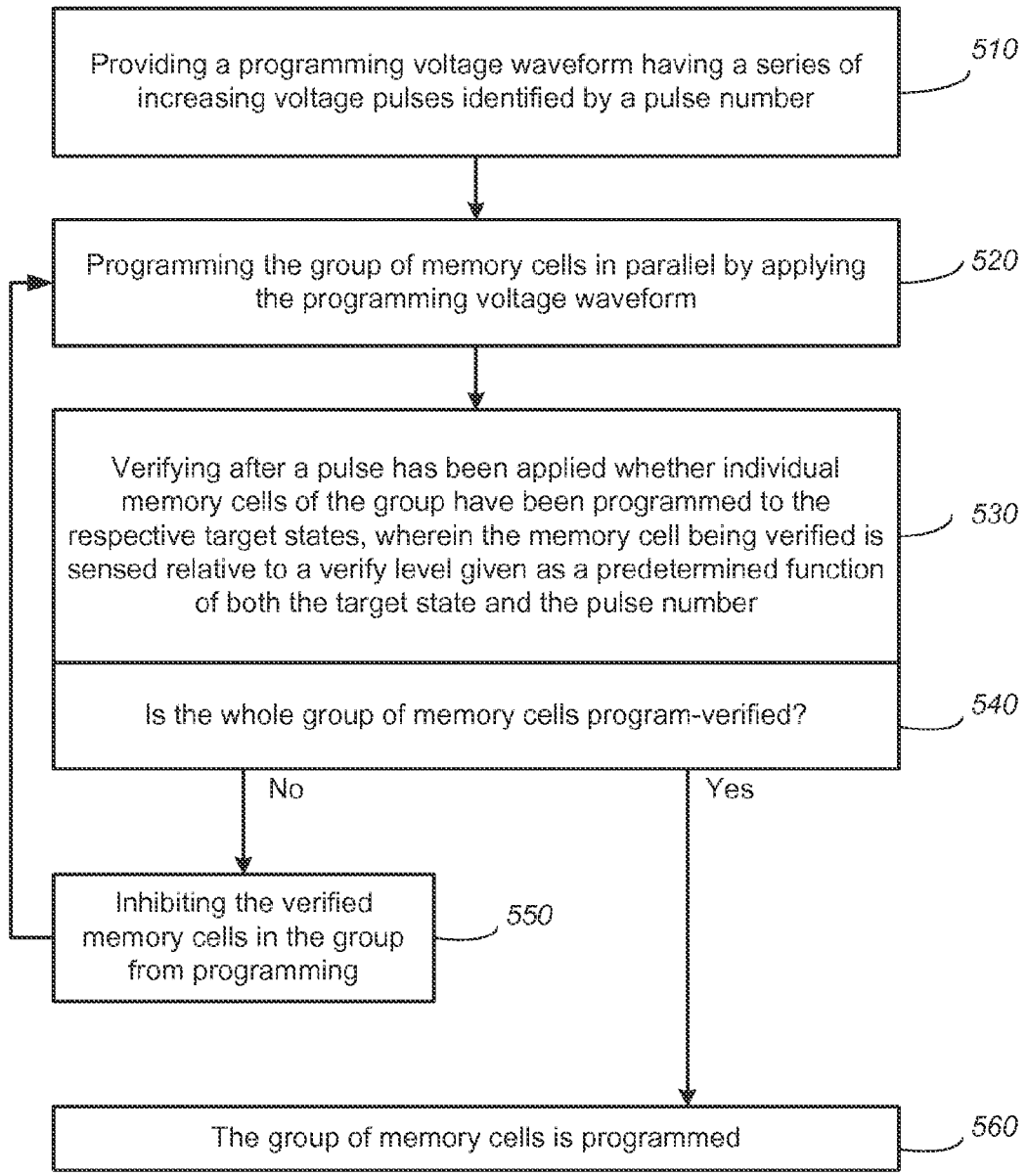
FIG. 16 is a flow diagram illustrating the improved programming using pulse-number-dependent verify levels.

FIG. 16 is a flow diagram illustrating the improved programming using pulse-number-dependent verify levels.

STEP 510: Providing a programming voltage waveform having a series of increasing voltage pulses identified by a pulse number.

STEP 520: Programming the group of memory cells in parallel by applying the programming voltage waveform.

STEP 530: Verifying after a pulse has been applied whether individual memory cells of the group have been programmed to the respective target states, wherein the memory cell being verified is sensed relative to a verify reference voltage given as a predetermined function of both the target state and the pulse number.

STEP 540: Is the whole group of memory cells program-verified? If "No" proceed to STEP 550; otherwise proceed to STEP 560.

STEP 550: Inhibiting the verified memory cells in the group from programming and return to STEP 520.

STEP 560: The group of memory cells is programmed.

In another embodiment, the improved method of programming employs verify levels compensated for the error in sensing due to a finite voltage gain/drop in a ground loop of a page of memory cells during a programming cycle. The voltage gain/drop is given by an aggregate current in the ground loop contributed by all the memory cells of the page. The compensation is estimated from a predetermined relation between the voltage drop and pulse number.

In particular, as the pulse number increases in a programming cycle, more and more memory cells of the page are program-verified. Each program-verified cell has its cell current turned off during subsequent to lockout verify operations and therefore has its contribution to the aggregate current removed. This forms the basis of determining the predetermined relation between the voltage gain/drop and pulse number and therefore the compensation for the verify level. Also as cells are programmed closer and closer to their respective target thresholds, the cell currents naturally reduce.

Figure 17:
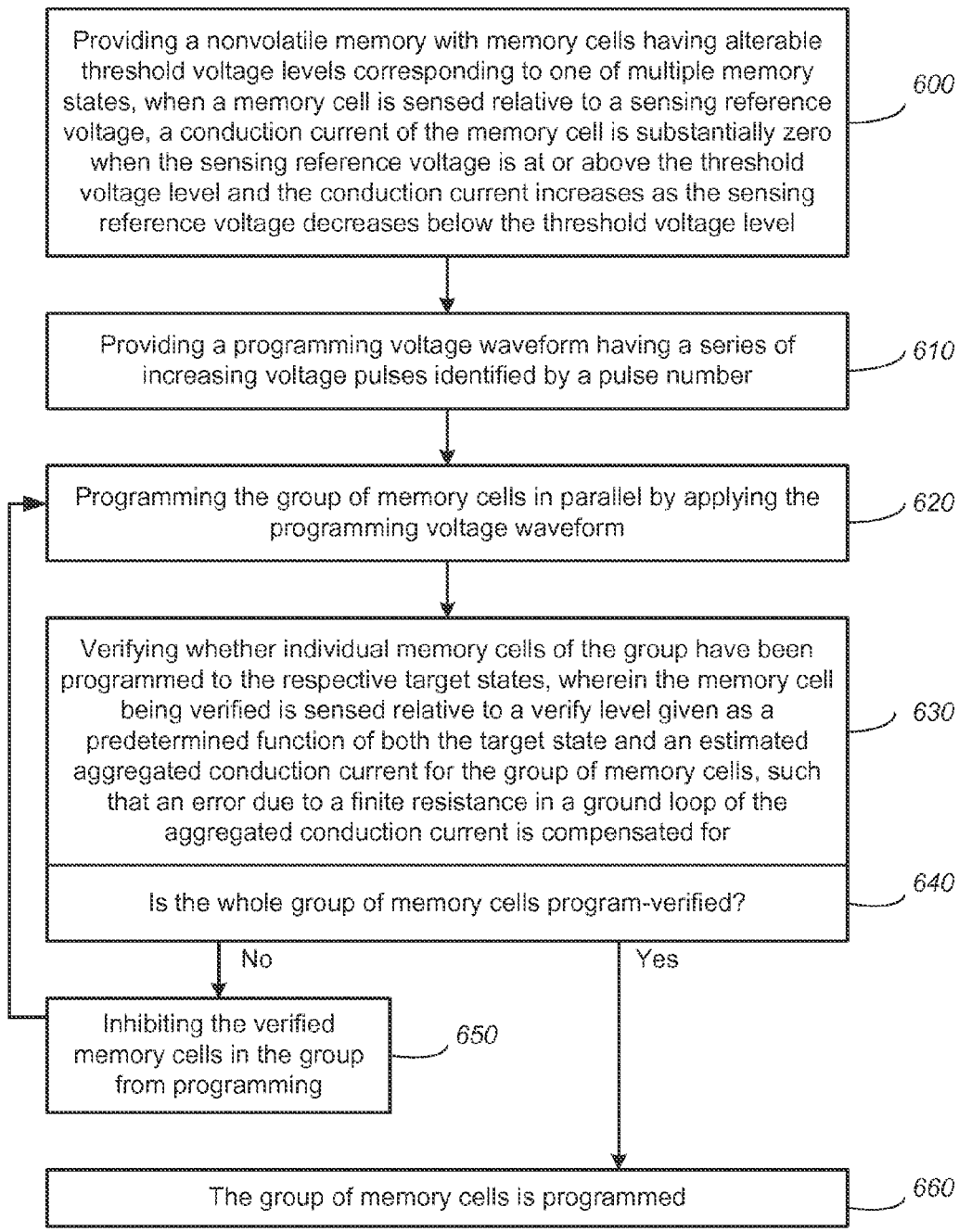
FIG. 17 is a flow diagram illustrating another improved programming where the verify levels are compensated for errors due to a finite resistance in a ground loop aggregating conduction currents of a page of memory cells.

FIG. 17 is a flow diagram illustrating another improved programming where the verify levels are compensated for errors due to a finite resistance in a ground loop aggregating conduction currents of a page of memory cells.

STEP 600: Providing a nonvolatile memory with memory cells having alterable threshold voltage levels corresponding to one of multiple memory states, when a memory cell is sensed relative to a sensing reference voltage, a conduction current of the memory cell is substantially zero when the sensing reference voltage is at or above the threshold voltage level and the conduction current increases as the sensing reference voltage decreases below the threshold voltage level.

STEP 610: Providing a programming voltage waveform having a series of voltage pulses identified by a pulse number.

STEP 620: Programming the group of memory cells in parallel by applying the programming voltage waveform.

STEP 630: Verifying whether individual memory cells of the group have been programmed to the respective target states, wherein the memory cell being verified is sensed relative to a verify level given as a predetermined function of both the target state and an estimated aggregated conduction current for the group of memory cells, such that an error due to a finite resistance in a ground loop of the aggregated conduction current is compensated for.

STEP 640: Is the whole group of memory cells program-verified? If "No" proceed to STEP 650; otherwise proceed to STEP 660.

STEP 650: Inhibiting the verified memory cells in the group from programming and return to STEP 620.

STEP 660: The group of memory cells is programmed.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Various aspects, advantages, features and embodiments of the present subject matters are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

It is claimed:

1. A memory device, comprising:
a plurality of memory cells;
a programming circuit configured to program the memory cells in parallel by a series of program pulses, each program pulse corresponding to a respective pulse number in the series; and
a read circuit configured to verify programming of a memory cell to a target state following a program pulse of the series based on a selected reference voltage potential,
the read circuit configured to select the reference voltage potential from a set of two or more different reference voltage potentials for the target state based on a pulse number of the program pulse in the series, such that a first reference voltage selected for verifying the programming of the memory cell to the target state following a first program pulse of the series differs from a second reference voltage selected for verifying the programming of the memory cell to the target state following a second program pulse of the series.

2. The memory device of claim 1, wherein the memory cells are in an erased state prior to being programmed.

3. The memory device of claim 1, wherein the memory cells are configured to store data coded in a pseudo-random pattern.

4. The memory device of claim 1, wherein:
the memory device further comprises a lookup table that stores the set of the two or more different reference voltage potentials, each of the two or more different reference voltage potentials corresponding to respective pulse numbers; and
the read circuit is configured to select the reference voltage potential from the table based on the pulse number of the program pulse.

5. The memory device of claim 1, wherein the memory cells are nonvolatile memory cells.

6. The memory device of claim 5, wherein the nonvolatile memory cells comprise electrically erasable programmable read-only memory (EEPROM) cells.

7. The memory device of claim 1, wherein the memory cells are embodied within a three-dimensional memory array.

8. A nonvolatile memory device, comprising:
an array of memory cells;
a programming circuit configured to program a plurality of the memory cells to respective target memory states in parallel by an ordered sequence of program pulses; and
a read circuit configured to verify the program of a memory cell of the plurality of memory cells by two or more verify operations, each verify operation performed after a respective one of the program pulses of the ordered sequence and using a determined reference voltage potential to verify whether the memory cell is programmed to a designated target memory state,
wherein the read circuit is configured to determine the reference voltage potential for a verify operation performed after a program pulse based on an order of the program pulse in the ordered sequence, such that the read circuit is configured to:
use a first reference voltage potential to verify whether the memory cell is programmed to the designated target memory state in a verify operation performed after a first program pulse of the ordered sequence, and
use a second reference voltage potential to verify whether the memory cell is programmed to the designated target memory state in a verify operation performed after a second program pulse of the ordered sequence,
wherein the second reference voltage potential is different from the first reference voltage potential.

9. The nonvolatile memory device of claim 8, wherein the programming circuit is further configured to inhibit a subsequent program pulse on the memory cell in response to the read circuit verifying programming of the memory cell to the designated target memory state.

10. The nonvolatile memory device of claim 8, wherein the programming circuit is further configured to set a bit line corresponding to the memory cell to a logic high voltage potential in response to the read circuit verifying that the memory cell has been programmed to the designated target memory state.

11. The nonvolatile memory device of claim 8, wherein:
the read circuit is further configured to identify one or more memory cells that are verified to be programmed to their respective target memory states in the verify operation performed after the first program pulse of the ordered sequence, and
the programming circuit is further configured to inhibit programming of the identified memory cells during one or more program pulses following the first program pulse in the ordered sequence.

12. The nonvolatile memory device of claim 8, wherein the read circuit is further configured to:
use a third reference voltage potential to verify whether one or more of the plurality of memory cells are programmed to a particular target memory state in the verify operation performed after the first program pulse of the ordered sequence, the particular target memory state different from the designated target memory state, and
use a fourth reference voltage potential to verify whether the one or more memory cells are programmed to the particular target memory state in the verify operation performed after the second program pulse of the ordered sequence, the fourth reference voltage potential different from the third reference voltage potential.

13. The nonvolatile memory device of claim 8, further comprising:
a plurality of different predetermined reference voltage potential values, each of the different predetermined reference voltage potential values configured for verifying memory cell programming to the designated target memory state after designated pulse numbers,
wherein the read circuit is further configured to select the second reference voltage potential from the predetermined reference voltage potential values based on a pulse number of the second program pulse in the ordered sequence.

14. The nonvolatile memory device of claim 13, wherein the plurality of different predetermined reference voltage potential values are configured to compensate for different source line load conditions following respective program pulses in the ordered sequence.

15. A memory device, comprising:
a programming circuit configured to program a plurality of memory cells to respective target memory states in parallel by a plurality of program pulses; and
a read circuit configured to verify programming of a memory cell to a particular target memory state in a plurality of sense operations, each sense operation corresponding to a respective one of the program pulses,
wherein the read circuit is further configured to vary a verify reference voltage threshold used to verify the programming of the memory cell to the particular target memory state in the respective sense operations based on the program pulses corresponding to the respective sense operations, such that the verify reference voltage threshold used to verify the programming of the memory cell to the particular target memory state in a first sense operation corresponding to a first one of the program pulses differs from the verify reference voltage threshold used to verify the programming of the memory cell to the particular target memory state in a second sense operation corresponding to a second one of the program pulses.

16. The memory device of claim 15, wherein:
the read circuit is further configured to verify that one or more of the memory cells have been programmed to their respective target memory states in response to the second sense operation; and
the programming circuit is further configured to inhibit a subsequent program pulse on the one or more memory cells.

17. The memory device of claim 15, wherein:
the read circuit is further configured to identify unverified memory cells, of the plurality of memory cells, that are not verified to be programmed to their respective target memory states in response to the first sense operation; and
the programming circuit is further configured to provide the second program pulse to the unverified memory cells.

18. The memory device of claim 15, wherein:
each of the plurality of sense operations comprises sensing a respective number of the plurality of memory cells in parallel, the number of memory cells corresponding to a number of the plurality of memory cells that have not been verified to be programmed to their respective target memory states prior to the program pulse corresponding to each sense operation; and
the read circuit is configured to vary the verify reference voltage threshold used to verify the programming of the memory cell to the target memory state in the second sense operation based on an estimate of the number of memory cells that are not verified to be programmed to their respective target memory states prior to the second program pulse.

19. The memory device of claim 18, wherein the second sense operation is performed after the first sense operation, and wherein the verify reference voltage threshold used in the first sense operation is higher than the verify reference voltage threshold used in the second sense operation.

20. The memory device of claim 15, wherein the memory cells are nonvolatile memory cells.

* * * * *